United States Patent [19]

Nestorovic

[11] 4,233,566
[45] Nov. 11, 1980

[54] DISTORTION FREE POWER LIMITING AND CLIPPING PREVENTION CIRCUIT

[75] Inventor: Mioljub Nestorovic, Edmonds, Wash.

[73] Assignee: Technical Audio Products Corporation, Redmond, Wash.

[21] Appl. No.: 953,754

[22] Filed: Oct. 23, 1978

[51] Int. Cl.³ .................... H03F 17/00; H03G 3/20
[52] U.S. Cl. .................................. 330/59; 330/138; 330/144
[58] Field of Search .............. 330/59, 144, 145, 284, 330/308, 138, 280

[56] References Cited

U.S. PATENT DOCUMENTS

| | | | |
|---|---|---|---|
| 3,379,991 | 4/1968 | Clerc et al. | 330/59 |
| 3,441,748 | 4/1969 | Werner | 330/145 UX |
| 3,496,452 | 2/1970 | Vollink | 330/59 X |
| 3,699,468 | 10/1972 | Harmgardt | 330/59 X |
| 3,849,734 | 11/1974 | Grass | 330/145 |
| 4,000,370 | 12/1976 | Smith et al. | 330/59 X |

FOREIGN PATENT DOCUMENTS

2435868  7/1975  Fed. Rep. of Germany .............. 330/59

*Primary Examiner*—James B. Mullins

*Attorney, Agent, or Firm*—Seed, Berry, Vernon & Baynham

[57] ABSTRACT

A circuit for limiting the output power of a power amplifier to a preselected value in order to prevent the amplifier from either clipping the input signal or applying potentially damaging signal levels to a loudspeaker connected to the output of the amplifier. The limiting and clipping circuit includes a voltage controlled attenuator through which the input signal passes before entering the amplifier. The amplifier output is compared to an output reference by a control circuit which supplies an attenuation command to the attenuator whenever the output level reaches the reference level. The value of the output reference can be easily adjusted from a fairly low percentage of the amplifier power capacity to the amplifier's maximum power capacity in which condition the circuit prevents amplifier clipping. The circuit is relatively quick to attenuate input signals responsive to excessive output levels, but is relatively slow to reduce the attenuation when the output level is subsequently lowered. Consequently, the circuitry quickly limits the output to safe and distortion free limits without itself introducing waveform distortion of signals in the audio range. Various embodiments of the invention may be employed depending upon specific circumstances.

13 Claims, 5 Drawing Figures

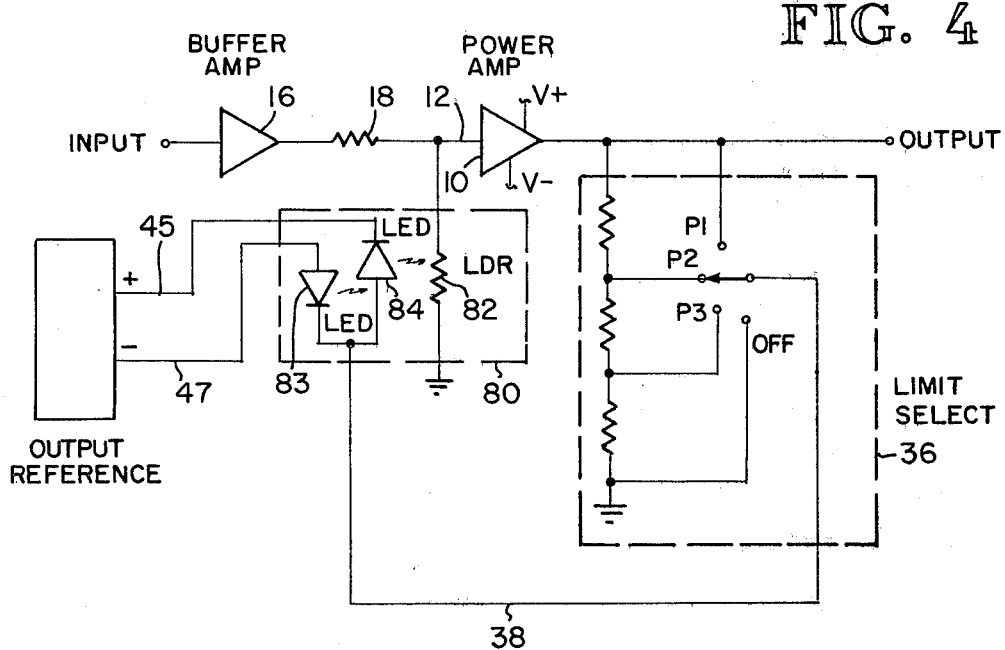
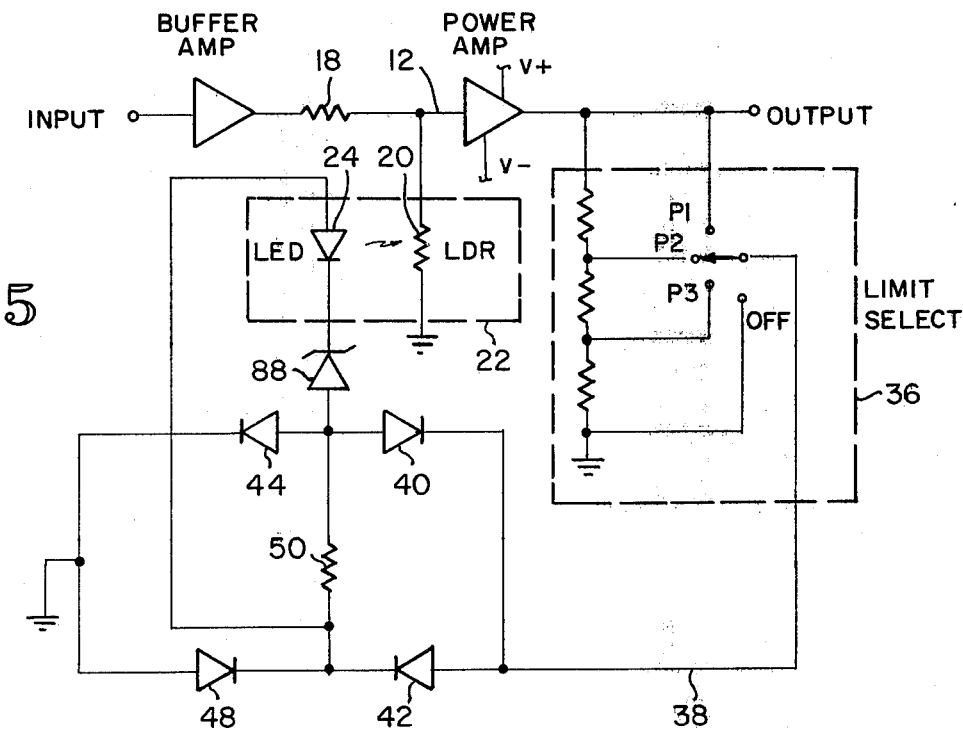

DISTORTION FREE POWER LIMITING AND CLIPPING PREVENTION CIRCUIT

BACKGROUND OF THE INVENTION

1. Field of the Invention

This invention relates to audio power amplifiers and, more particularly, to a circuit for limiting the output level of an amplifier to prevent clipping and loudspeaker damage.

2. Description of the Prior Art

Audio power amplifiers in the professional sound field are generally used to drive loudspeakers for sound reproduction. Often the loudspeakers have power ratings less than the maximum power output of the driving amplifier. This does not present a problem as long as the amplifier is operated at a power level less than the rated power capacity of the loudspeaker. However, power amplifiers are generally fixed gain devices so that the output power of the amplifier driving a fixed resistance load is a fixed multiple of the input signal level. Consequently, a relatively large input signal can easily produce an output of sufficient power to damage the loudspeaker, particularly where the loudspeaker is a conventional horn drivers typically used with professional installations.

An associated problem occuring when a power amplifier is driven to its output limit is amplifier clipping. Basically, amplifier clipping occurs when the output voltage of the amplifier approaches the power supply voltage so that the output voltage can no longer increase in proportion to the input signal. Amplifier clipping causes two distinct problems. First, the clippinng distorts the input signal by generating harmonics of the input signal which greatly depreciate the quality of the sound emanating from the loudspeakers. Second, as clipping becomes more severe the output waveform approaches a square wave so that the average power of the clipped signal continues to increase thereby increasing the possibility of loudspeaker damage.

Amplifier clipping and its attendant consequences have long been a problem in the audio field and attempts have been made to eliminate or at least control it. One solution might be to limit the amplitude of the input signal to a safe value such as by shunting the input terminal with a zener diode. While this solution would to some extent alleviate the problem of loudspeaker damage, the shunted signal would itself be clipped so that the amplitude limited output signal would be extremely distorted and its power would increase as the clipping became more severe.

Another solution to the clipping problem taught by U.S. Pat. No. 4,048,573 issued to Evans et al. Evans et al compare the output of the power amplifier to its input to generate an attenuation command signal whenever the ratio of the output signal to the input signal does not correspond to the gain of the amplifier. The attenuation command causes current to flow through a light emitting diode of a light emitting diode/light dependent resistor pair with the reisistor shunting the input. Thus, whenever clipping occurs and the output is no longer a fixed multiple of the input, the input is shunted a sufficient amount to maintain a predetermined level of clipping. One of the problems with this circuit is that it requires distortion to produce attenuation, i.e. it can only function by allowing some degree of clipping, and clipping is distortion. Thus, the output signal will always be a distorted reproduction of the input signal when the circuit is functioning to limit the output level to the maximum output level. Additionally, the circuit lacks a great deal of flexibility such as the ability to limit the output level of the power amplifier to a predetermined value. For example, a 200 watt power amplifier may be driving loudspeakers having a rated capacity of 50 watts. While the Evans et al anti-clipping circuit will be effective in preventing clipping, the 50 watt loudspeaker will be destroyed long before clipping is a problem. Finally, the Evans et al circuit is relatively complex and it employs a fairly large number of components.

SUMMARY OF THE INVENTION

It is an object of the invention to provide a circuit for preventing amplifier clipping which does not require that amplifier distortion be maintained in order to operate.

Another object of the invention is to provide a clipping prevention circuit for an amplifier which may also be used to limit the output level of the amplifier to a manually adjustable value.

It is still another object of the invention to provide a circuit for limiting the output level of an amplifier to a value which varies with variations and amplifier power supply voltage.

It is a further object of the invention to provide a circuit for preventing amplifier clipping and for limiting the output level of an amplifier which can be implemented with relatively few electrical components.

These and other objects of the invention are accomplished by directing the input signal to the amplifier through a voltage-controlled attenuator which reduces the level of the input signal by an amount determined by an attenuator control signal. A reference circuit provides a preselected output reference which is compared to the output of the amplifier to determine when the amplifier output approaches the preselected reference. The attenuator control signal is then generated to attenuate the input signal to prevent the output from exceeding the preselected reference. The value of the output reference can be easily adjusted from a fairly low percentage of the amplifier power capacity to the amplifier's maximum power capacity in which condition the circuit prevents amplifier clipping. The output reference may either be a fixed value such as provided by a zener diode or a specific percentage of the amplifier power supply voltage so that the preselected output reference varies with variations in power supply voltage. If desired, the output level may be compared to both positive and negative output reference signals to generate the attenuator control signal if the output level exceeds either the positive or negative reference. The voltage controlled attenuator is preferably a light emitting diode/light dependent resistor with the resistor shunting the input signal and the diode receiving the amplifier control signal. The response time of the resistor should be fairly short in a resistance decreasing direction but fairly long in the resistance increasing direction in order to allow the circuit to quickly respond to high power transients without reducing attenuation during the course of a singl cycle which would introduce waveform distortion. The circuit may be implemented with a wide variety of specific embodiments, each of which utilize a relatively small number of components.

BRIEF DESCRIPTION OF THE DRAWINGS

FIG. 4 is a schematic of another embodiment of the power limiting and clipping prevention circuit.

FIG. 5 is a schematic of still another embodiment of the power limiting and clipping prevention circuit.

DETAILED DESCRIPTION OF THE INVENTION

Figure 1:
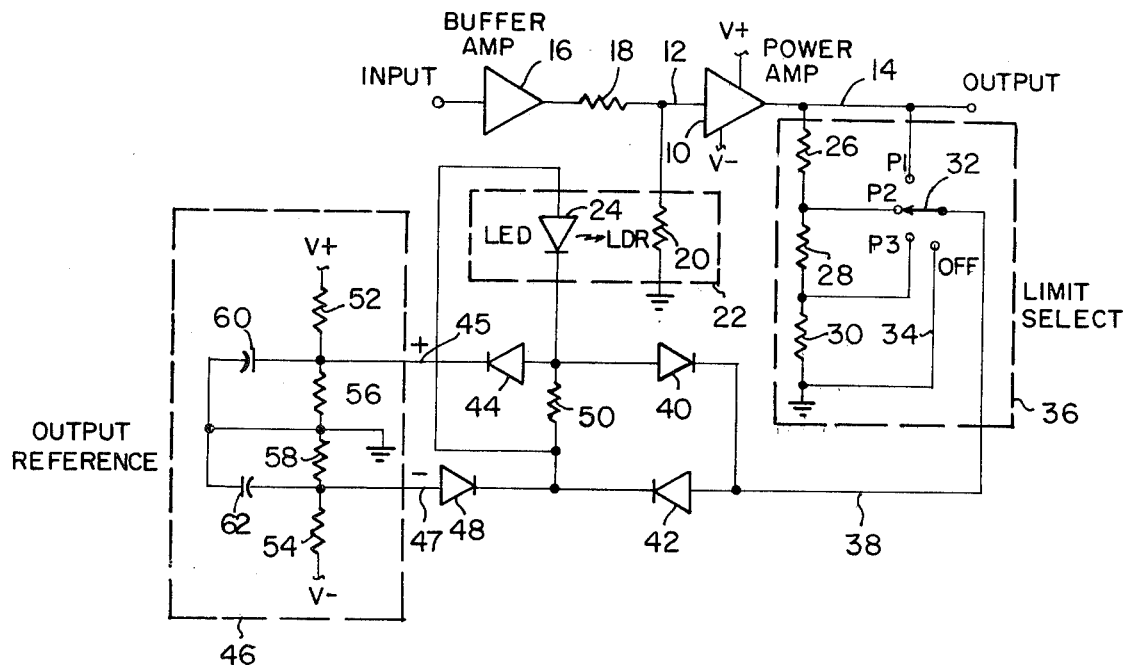
FIG. 1 is a schematic of one embodiment of the power limiting and clipping prevention circuit.

A typical power amplifier 10 as illustrated in FIG. 1 receives a relatively low amplitude signal on an input line 12 and provides a signal having a significantly greater amplitude on its output line 14. Although such power amplifiers 10 are normally rated for a specific power capacity, this rating is only valid for specific load resistances since the amplifiers are fixed voltage gain devices. In operation, the output of the power amplifier 10 is normally limited to a specific voltage which is normally a function of the amplifier power supply voltage. Thus, the term "output level" of the amplifier 10 as used herein generally refers to the output voltage of the amplifier 10 placed across a given load resistance.

The input signal 12 to the power amplifier 10 may be provided by a buffer amplifier 16 which has a high input impedance. A resistor 18 may be placed between the output of the buffer amplifier 16 and the input of the power amplifier 10. In some cases, however, the output impedance of the buffer amplifier 16 may be sufficiently high to obviate the need for a separate resistance 18.

The resistance 18 forms a voltage divider with a light dependent resistor 20 of a conventional light emitting diode/light dependent resistor pair 22. As well understood, the resistance of the light dependent resistor 20 is inversely proportional to the light received from a light emitting diode 24 mounted adjacent the light dependent resistor 20. The intensity of the light generated by the diode 24 is, in turn, a function of the current passing through the diode 24. The LED/LDR pair thus attenuates the input signal by an amount determined by the current flowing through the LED 24.

The output of the power amplifier 10 is applied to a tapped resistance formed by series resistors 26, 28, 30 forming a voltage divider. The output line 14 and the taps between the resistors 26-30 are applied to a conventional rotary switch 32 which places one of the signals on an output line 38 for comparison with an output reference. The switch 32 may also be grounded through line 34 to disable the power limiting and clippling prevention circuit. Thus, the limit select circuit 36 places a manually selectable percentage of the output signal from the amplifier 10 on its output line 38 for comparison with a fixed reference.

The limit select output line 38 is connected to the cathode of diode 40 and the anode of diode 42. When the output of the limit select circuit 36 exceed a positive output reference by sufficient magnitude, generally about 3 volts (two 0.6 volt diode drops and one 1.8 volt LED drop), current flows from output line 38 sequentially through diode 42, the LED 24 and diode 44 to a positive output reference line 45 of an output reference circuit 46. The current flowing through the LED 24 lowers the resistance of the LDR 20 to attenuate the input signal on line 12. When the output of the limit select 36 on line 38 becomes more negative than a negative output reference by a sufficient amount, current flows from a negative reference linne 47 of the output reference circuit 46 sequentially through diode 48, the LED 24 and the diode 40 to line 38 thereby lowering the resistance of the LDR 20 and attenuating the input signal on line 12. A resistor 50 is placed in parallel with the LED 24 to bleed some of the current from the LED 24 in order to adjust the gain of the circuit.

One embodiment of the output reference 46 includes a voltage divider network connected between the positive and negative supply voltages V+, V−, respectively. The divider network includes resistors 52, 54, preferably of equal values, and resistors 56, 58, preferably of equal values. The junction between resistors 56 and 58 is grounded to provide a zero reference potential. The junction between resistors 52, 56 thus provides a positive output reference while the junction between resistors 54, 58 provide a negative output reference. Capacitors 60, 62 are placed across resistors 56, 58, respectively, to provide the reference lines with a low AC output impedance. Since the output references of circuit 46 is a fixed percentage of the power supply voltages V+, V−, the reference voltages on lines 45, 47 "track" any variations in the power supply voltages V+, V−. Thus the inventive circuit automatically compensates for variations in the clipping level of the amplifier 10 resulting from variations in the power supply voltages V+, V−.

The power limiting and clipping prevention circuit of FIG. 1 thus compares a percentage of the power amplifier output as selected by switch 32 to a positive and negative output reference through a diode network. The diode network allows current to flow through the LED 24 whenever the preselected percentage of the amplifier output either becomes more positive than the positive output reference or more negative than the negative output reference. As current flows through the LED 24, the light thereby generated reduces the resistance of the LDR 20 to attenuate the input signal on line 12.

The response time of the LDR is preferably relatively fast in a resistance decreasing direction but relatively slow in a resistance increasing direction. Consequently, the circuit can respond to power transients in less than one AC cycle at typical audio frequencies but the resistance of LDR 20 is not materially decreased during the decreasing portion of the AC cycle. If the response time of the LDR 20 was significantly faster, the circuit would respond to each individually waveform by reducing the overall gain of the amplifier 10 at a specific amplitude of each AC cycle. Under these circumstances the waveform at the output of the amplifier 10 would be somewhat distorted since attenuation of the input signal would not occur until the input signal reached a level corresponding to the clipping level of the amplifier. Thus, the gain of the amplifier would not be constant. By retaining an attenuation level for a fairly long period of time substantially longer than a single cycle, the amplifier gain remains constant causing the input signal to be attenuated throughout the entire cycle so that the output of the power amplifier 10 is a linear function of the input.

As a matter of circuit design, the voltages of the output references on lines 45, 47 should be about 3 volts less than the voltage at the output of the amplifier 10 at the minimum level of output limiting. Under these circumstances current flows through the LED 24 at this minimum output level limit when the switch 32 is in the P$_1$ position. As the switch is moved to other positions, P$_2$, P$_3$ a smaller percentage of the output of amplifier 10 is applied to diodes 40, 42 so that input attenuation occurs at a higher output level.

Figure 2:
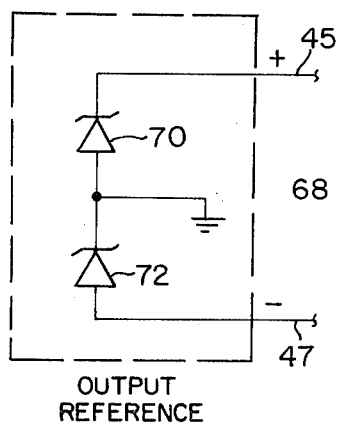
FIG. 2 is a schematic illustrating an alternative embodiment of an output reference circuit.

An alternative embodiment of an output reference circuit 68 is illustrated in FIG. 2. This circuit 68 utilizes a pair of zener diodes 70, 72 with the anode of diode 70 and the cathode of diode 72 connected to ground. The diode 70 provides a positive output reference on line 45 while the diode 72 provides a negative output reference on line 47. When the output reference circuit 68 is substituted for the output reference 46 of FIG. 1, current flows sequentially from the limit select output line 38 through diode 42, the LED 24, diode 44 and the zener diode 70 whenever the voltage on line 38 exceeds the reverse breakdown voltage of the zener diode 70 by about 3 volts. Similarly, whenever the output of the limit select circuit 36 becomes about 3 volts more negative than the reverse breakdown voltage of the zener diode 72, current sequentially flows through diode 72, diode 48, the LED 24 and diode 40. The principal difference between the output reference circuit 46 illustrated in FIG. 1 and the output reference circuit 68 illustrated in FIG. 2 is that the output reference voltages provided by the circuit 46 will "track" the power amplifier power supply voltages as mentioned above so that the output level at which input attenuation occurs varies in accordance with the variation in the normal clipping level of the amplifier. The circuit 68, on the other hand, provides a fixed clipping level regardless of variations in the voltage of the power amplifier power supply.

Figure 3:
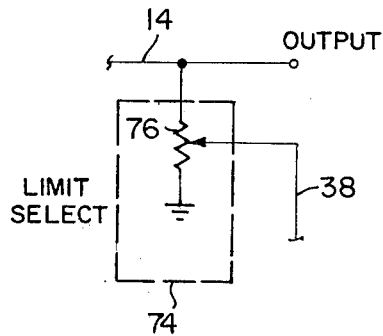
FIG. 3 is a schematic illustrating an alternative embodiment of a limit select circuit.

The limit select circuit 36 of FIG. 1 applies a discrete percentage of the output to the limit select output line 38 as determined by switch 32. Although circuit 36 selects one of four discrete percentage values, the limit select circuit 74 illustrated in FIG. 3 may be used to limit the output power of the amplifier 10 to a continuously adjustable value. The limit select circuit 74 of the FIG. 3 simply utilizes a potentiometer 76 having its winding connected between the output line 14 and ground with the potentiometer center tap connected to the limit select output line 38.

An alternate embodiment of the power limiting and clippling prevention circuit is illustrated in FIG. 4. This embodiment utilizes a number of components which are identical to the embodiment of FIG. 1 and are thus designated by identical reference numerals. These identical components include the buffer amplifier 16, resistor 18, power amplifier 10, limit select circuit 36 and output reference circuit 46. The embodiment of FIG. 4 differs from the embodiment of FIG. 1 principally in that it employs a voltage controlled attenuator 80 implemented by a commercially available device having a single light dependent resistor packaged with a pair of light emitting diodes 82, 84. The light dependent resistor 82 shunts the input line 12 to attenuate the input signal. Like the embodiment of FIG. 1, the embodiment of FIG. 4 compares the voltage on the output line 38 of the limit select circuit 36 to the positive and negative output references from the output reference circuit 46 to generate an attenuation command when the magnitude of a power amplifier output level exceeds a value determined by the limit select circuitry 36. When the voltage on the limit select output line 38 exceeds the positive output reference on line 45 from the output reference circuit 46 by about 1.8 volts (the diode drop of LED 84) current flows through the light emitting diode 84 thereby generating light which reduces the resistance of LDR 82 to attenuate the input signal on line 12. Similarly, when the voltage on the limit select output line 38 becomes about 1.8 volts more negative than the negative output reference on line 47 from the output reference circuit 46 current flows through LED 82 thereby attenuating the input signal on line 12.

Still another embodiment of the power limiting and clipping prevention circuitry is illustrated in FIG. 5. As with the embodiment of FIG. 4, the electrical components of this circuit which are identical to corresponding components of the embodiment of FIG. 1 have been given identical reference numerals. The embodiment of FIG. 5 utilizes a single zener diode 88 to provide the output reference and it uses the diode network of FIG. 1 to provide signals of the proper polarity across the light emitting diode 24 of the LED/LDR pair 22. When the voltage on the limit select output line 38 is more positive than the reverse breakdown voltage of the zener diode 88 by about 3 volts current flows through diode 42, LED 24, zener diode 88 and diode 44. Similarly, when the voltage on the limit select output line 48 becomes more negative than the reverse breakdown voltage of the zener diode 88 by about 3 volts, current flows through diode 48, LED 24, zener diode 88 and diode 40. In both of these cases the LED 24 generates light which reduces the resistance of LDR 20 thereby attenuating the input signal on line 12.

The inventive circuit is thus able to prevent clipping without itself introducing distortion, and it limits the output level from a power amplifier to a manually presettable output limit.

I claim:

1. In an amplifier for increasing the amplitude of an input signal in order to generate a relatively high amplitude output signal, said amplifier being powered by a DC power supply generating a DC supply voltage from an AC power input in which the magnitude of said supply voltage may vary to some extent responsive to variations in the voltage of said power input and the magnitude of said output signal in order to establish a clipping level for said amplifier, a circuit for limiting the level of said output signal to an output level which is a function of the magnitude of said supply voltage, comprising:

a voltage controlled attenuator connected to the input of said amplifier for reducing the amplitude of the input signal responsive to an attenuator control signal;

reference means for providing a preselected output reference which is a function of the magnitude of said supply voltage and of the clipping level of said amplifier such that said output reference corresponds to the maximum woltage of said output signal which varies in accordance with the variation of the supply voltage for said amplifier; and comparator means receiving the output of said amplifier and said output reference for generating said control signal responsive to a predetermined percentage of said output signal reaching said output reference as said output signal approaches said clipping level whereby said amplifier may produce the maximum available power without clipping as the maximum available power varies.

2. The limiting circuit of claim 1 further including adjusting means for varying the output level at which said attenuation command is generated.

3. The limiting circuit of claim 1 wherein said reference means includes voltage divider means for deriving said output reference as a fixed ratio of said supply voltage.

4. The limiting circuit of claim 3 wherein said comparator means compares a manually variable ratio of the amplifier output to said output reference to allow the output level to be limited to a plurality of manually adjustable values.

5. In an amplifier for increasing the amplitude of an input signal in order to generate a relatively high amplitude output signal, said amplifier being powered by a DC power supply generating positive and a negative DC supply voltages from an AC power input in which the magnitude of said supply voltages may vary to some extent responsive to variations in the voltage of said power input and the magnitude of said output signal, a circuit for limiting the level of said output signal to an output level which is a function of the mangitude of said supply voltage, comprising:

a voltage controlled attenuator connected to the input of said amplifier for reducing the amplitude of the input signal responsive to an attenuator control signal;

reference means for generating negative and positive output references which are a function of the magnitude of said negative and positive supply voltages, respectively, such that the magnitude of said negative and positive output references vary in accordance with the variaof the respective negative and positive supply voltages for said amplifier; and comparator means receiving the output of said amplifier and said negative and positive output references, said comparator means including means for comparing said output signal to said positive output reference when said output signal is positive and for comparing said output signal to said negative output reference when said output signal is negative, said comparator means further including means for generating said control signal when the absolute value ofsaid output signal exceeds the absolute value of a predetermined ratio of the output reference to which said output signal is being compared such that the positive and negative clipping levels of said output signal are independent from each other; whereby said amplifier may produce the maximum available power without clipping as the maximum available power varies.

6. In an amplifier for increasing the amplitude of an input signal in order to generate a relatively high amplitude output signal, said amplifier being powered by a DC power supply generating a DC supply voltage from an AC power input in which the magnitude of said supply voltage may vary to some extent responsive to variations in the voltage of said power input and the magnitude of said output signal, a circuit for limiting the level of said output signal to an output level which is a function of the magnitude of said supply voltage, comprising:

reference means for providing a preselected output reference which is a function of the magnitude of said supply voltage such that said output reference varies in accordance with the variation of the supply voltage for said amplifier; and a light emitting diode/light dependent resistor pair with said resistor shunting said input signal and said diode having one of its terminals receiving a voltage which is directly proportional to the output level of the amplifier and the other of its terminals receiving said output reference such that current flows through said diode responsive to the level of said output exceeding a predetermined reference level thereby generating light which reduces the resistance of said resistor to attenuate said input signal.

7. The limiting circuit of claim 6 wherein said light emitting diode/light dependent resistor pair has a relatively fast turn-on time and a relatively slow turn-off time such that said circuit quickly responds to excessive power levels yet retains a given attenuation level subsequent to reduction of said output level for a relatively long period.

8. The limiting circuit of claim 6 wherein said DC power supply produces a negative and a positive supply voltage, and said reference means generates a positive output reference and a negative output reference which are functions of the magnitudes of said negative and positive supply voltages, respectively, and wherein said limiting circuit includes a first diode having its cathode connected to the anode of a second diode and to the output of said amplifier, a third diode having its anode connected to the cathode of said light emitting diode and the anode of said first diode and its cathode receiving said positive output reference, and a fourth diode having its cathode connected to the anode of said light emitting diode and the cathode of said second diode and its anode receiving said negative output reference such that an output level significantly more positive than a level corresponding to said positive output reference causes current to flow from said output to said reference means sequentially through said second diode, light emitting diode and third diode thereby attenuating the input signal to limit the output level of said amplifier and an output level significantly more negative than said negative reference causes current to flow from said reference means through said output sequentially through said fourth diode, light emitting diode and first diode, thereby attenuating the input signal to limit the output level of said amplifier.

9. The limiting circuit of claim 8 wherein said reference means includes a first pair of voltage divider resistors connected between said positive supply voltage and ground to generate said positive output reference therebetween and a second pair of voltage divider resistors connected between said negative supply voltage and ground to generate said negative output reference therebetween.

10. The limiting circuit of claim 6 further including a resistor connected in parallel with said light emitting diode for adjusting the gain of said limiting circuit.

11. In an amplifier for increasing the amplitude of an input signal in order to generate a relatively high amplitude output signal, a circuit for limiting the level of said output signal to a preselected output level, comprising:

reference means for providing a preselected output reference;

comparator means receiving the output of said amplifier and said output reference for generating a control signal responsive to a predetermined percentage of said output signal reaching a level corresponding to said output reference; a voltage controlled attenuator including a dual light emitting diode/light dependent resistor pair with said resistor shunting said input signal, one of said light emitting diodes having its anode receiving a voltage proportional to the output level of said amplifier and its cathode connected to a positive output reference and the other of said light emitting diodes having its cathode receiving a voltage proportional to the output level of said amplifier and its anode connected to a negative output reference.

12. In an amplifier for increasing the amplitude of an input signal in order to generate a relatively high amplitude, bipolar output signal, said amplifier being powered by a DC power supply generating positive and negative DC supply voltages, a circuit for limiting the level of said output signal to a preselected positive output level and a preselected negative output level, comprising:

a voltage controlled attenuator connected to the input of said amplifier including a light emitting diode/light dependent resistor pair with said resistor shunting said input signal;

reference means for providing a positive output reference and a negative output reference; and a first diode having its cathode connected to the anode of a second diode and to the output of said amplifier, a third diode having its anode connected to the cathode of said light emitting diode and the anode of said first diode and its cathode receiving said positive output reference, and a fourth diode having its cathode connected to the anode of said light emitting diode and the cathode of said second diode and its anode receiving said negative output reference such that an output level significantly more positive than a level corresponding to said positive output reference causes current to flow from said output to said reference means sequentially through said second diode, light emitting diode and third diode thereby attenuating the input signal to limit the output level of said amplifier, and an output level significantly more negative than said negative reference causes current to flow from said reference means through said output sequentially through said fourth diode, light emitting diode and first diode, thereby attenuating the input signal to limit the output level of said amplifier.

13. In an amplifier for increasing the amplitude of an input signal in order to generate a relatively high amplitude, bipolar output signal, said amplifier being powered by a DC power supply generating positive and negative DC supply voltages, a circuit for limiting the level of said output signal to a preselected positive output level and a preselected negative output level, comprising:

a voltage controlled attenuator connected to the input of said amplifier for reducing the amplitude of the input signal responsive to an attenuator control signal;

reference means for providing a positive output reference and a negative output reference, said reference means including a first pair of voltage divider resistors connected between said positive supply voltage and ground to generate said positive output reference therebetween and a second pair of voltage divider resistors connected between said negative supply voltage and ground to generate said negative output reference therebetween; and comparator means receiving the output of said amplifier and said positive and negative output references for comparing said output signal to said positive output reference when said output signal is positive and for comparing said output signal to said negative output reference when said output signal is negative, said comparator means further including means for generating said control signal when the absolute value of said output signal exceeds the absolute value of a predetermined ratio of the output reference to which said output signal is being compared such that the positive and negative clipping levels of said output signal are independent from each other.

* * * * *